United States Patent [19]

Muraoka et al.

[11] 4,239,661
[45] Dec. 16, 1980

[54] SURFACE-TREATING AGENT ADAPTED FOR INTERMEDIATE PRODUCTS OF A SEMICONDUCTOR DEVICE

[75] Inventors: Hisashi Muraoka, Yokohama; Masafumi Asano, Yokosuka; Taizo Ohashi, Kanagawa; Yuzo Shimazaki, Tokyo, all of Japan

[73] Assignee: Tokyo Shibaura Electric Co., Ltd., Japan

[21] Appl. No.: 927,139

[22] Filed: Jul. 21, 1978

Related U.S. Application Data

[62] Division of Ser. No. 718,911, Aug. 30, 1976.

[30] Foreign Application Priority Data

Nov. 26, 1975 [JP] Japan .................. 50-140721
Nov. 26, 1975 [JP] Japan .................. 50-140722
Nov. 26, 1975 [JP] Japan .................. 50-140723
Nov. 26, 1975 [JP] Japan .................. 50-140724
Nov. 26, 1975 [JP] Japan .................. 50-140725
Nov. 26, 1976 [JP] Japan .................. 50-140726

[51] Int. Cl.$^3$ .............. C11D 3/26; C11D 3/30; C11D 7/32
[52] U.S. Cl. ............... 252/541; 134/42; 252/547; 252/548; 260/404; 260/501.15
[58] Field of Search ........... 252/156, 548, 547, 528, 252/529; 260/501.15, 251.5, 404; 134/25 R, 42

[56] References Cited

U.S. PATENT DOCUMENTS

| | | | |
|---|---|---|---|
| 2,676,955 | 4/1954 | Weitkamp et al. | 252/547 |
| 2,774,759 | 12/1956 | Plackett et al. | 260/501.15 X |
| 3,503,890 | 3/1970 | Davisson et al. | 252/156 |
| 3,553,143 | 1/1971 | Bauer | 252/156 X |
| 3,980,587 | 9/1976 | Sullivan | 252/156 X |

OTHER PUBLICATIONS

The Merck Index of Chemicals and Drugs, 1960, Publ. by Merck & Co. Inc., Rahway, N.J. p. 253.

*Primary Examiner*—Thomas J. Herbert, Jr.
*Attorney, Agent, or Firm*—Finnegan, Henderson, Farabow, Garrett & Dunner

[57] ABSTRACT

A surface-treating agent formed of an aqueous solution containing 0.01 to 20% by weight of trialkyl(hydroxyalkyl) ammonium hydroxide. The treating agent is adapted to be used for the effective removal of organic and inorganic contaminants deposited on the surface of intermediate semiconductor products obtained in the respective steps of manufacturing a semiconductor device and the efficient etching of a metal layer used as wiring. Further, it can be used for the elimination of those portions of a positive working photoresist film coated on the surface of the intermediate semiconductor products which are and are not exposed to a light by controlling its concentration.

32 Claims, 7 Drawing Figures

SURFACE-TREATING AGENT ADAPTED FOR INTERMEDIATE PRODUCTS OF A SEMICONDUCTOR DEVICE

This is a division of application Ser. No. 718,911, filed Aug. 30, 1976.

FIELD OF THE INVENTION

This invention relates to a surface-treating agent used during the manufacture of a semiconductor device, and more particularly to a surface-treating agent adapted for the washing of the surface of intermediate semiconductor products obtained in the respective steps of manufacturing a semiconductor device, the etching of a metal layer used as wiring and the removal of those portions of a positive-working photoresist film which are and are not exposed to a light.

DESCRIPTION OF THE PRIOR ART

Semiconductor devices such as transistors, diodes, integrated circuits, rectifying elements, thyristors, etc. are at present mostly based on silicon. The semiconductor device is generally prepared through various steps of growing required layers in gas phase, forming oxide films and depositing metal layers all on a semiconductor substrate, diffusing an impurity in the semiconductor substrate and fitting electrodes thereto. Since the properties of the semiconductor device is prominently affected by an impurity or contaminant, it is necessary to wash the surface of an intermediate product obtained in each preceding step in order to remove as much as possible undesired organic and inorganic contaminants, before each succeeding step is conducted.

Depending on the kind of chemicals used as a surface-treating agent and surface-treating temperature, the abovementioned washing may be effected by various processes. Basically, the washing comprises the steps of degreasing organic contaminants such as lapping oil, dissolving off the unnecessary metalic contaminants by acid solution and drying the surface of the respective intermediate products by centrifugal dehydration or blowing high purity nitrogen gas on the surface.

An alkaline aqueous solution containing alkali metal compounds such as sodium hydroxide and sodium carbonate is generally found effective for removal of organic contaminants like oil deposited on a metal surface, and is often used for this purpose. However, an alkali metal, particularly sodium is converted into a movable ion in a silicon oxide film prominently to degrade the properties of, for example, an MOS type semiconductor device or planar type bipolar device. Moreover, sodium present on the surface of the silicon oxide film is readily introduced thereinto to deteriorate a semiconductor device. In the field of manufacturing a semiconductor device, therefore, degreasing of oil by an alkali metal compound is only applied in manufacturing, for example, a thyristor in which the presence of an alkali metal does not raise a considerable problem. Obviously, absence of an alkali metal is more preferred for the thyristor. In this connection, there will now be described the experiments of the present inventors which were conducted to find the extent to which the presence of sodium impaired the properties of a semiconductor device, by applying an aqueous solution formed of a mixture of sodium phosphate and sodium silicate hitherto used in removing (development) those portions of a positive-working photoresist film which were exposed to a light.

The present inventors' experiments were carried out in the following manner. An oxide film was formed on the surface of an N type silicon wafer having a specific resistance of 44 $\Omega$cm and a crystal plane of <311>, after said surface was washed. Two kinds of sample were prepared, that is, the one (sample B) coated with a layer of phosphosilicate glass to capture sodium and the one (sample A) which was not coated with phosphosilicate galss layer. The samples A and B were dipped in the aqueous solution containing a mixture of sodium phosphate and sodium silicate, followed by washing with deionized water. The samples A and B were each fitted with an electrode to form an MOS capacitor. In this case the sample B was previously stripped of the phosphosilicate glass layer. Measurement was made of the shifting of flat band voltage $V_{FB}$ in the MOS capacitors made from the samples A and B by a bias temperature (BT) test. The BT test was carried out by impressing positive or negative voltage of $10^6$V/cm on the MOS capacitor at 300° C. for 10 minutes, the results being presented in FIGS. 1A and 1B. Marks O shown in FIGS. 1A and 1B represent a +BT treatment or the case where the MOS capacitors were impressed with positive bias voltage and marks X given in FIGS. 1A and 1B relate to a −BT treatment or the case where the MOS capacitors were impressed with negative bias voltage. FIGS. 1A and 1B show the results of the BT test conducted on the MOS capacitors obtained from the samples A and B, respectively. As is apparent from FIGS. 1A and 1B, the flat band voltage $V_{FB}$ presented a noticeable shift in the MOS capacitor obtained from the sample A in both +BT and −BT tests. Even in the MOS capacitor obtained from the sample B, the flat band voltage $V_{FB}$ indicated a relatively noticeable shift. Namely, FIGS. 1A and 1B prove that the presence of sodium deteriorates the properties of the MOS capacitor. The character $N_{FB}$ appearing in FIGS. 1A and 1B denotes an amount of surface charge.

The succeeding acid treatment constitutes an important central step of washing. Generally, an oxidizing acid, particularly, nitric acid is applied to assure reliable washing.

Treatment of a silicon wafer with an oxidizing acid including nitric acid often results in the formation of a very thin oxide film on the surface of the wafer. Where oxidization is undertaken under heat, the oxide film is grown very quickly. The oxide film is also formed rapidly, where washing is effected by sulfuric acid. Occurrence of the oxide film is objectionable, because the film absorbs a metal impurity in the process of being removed. For example, aqua regia which dissolves gold very effectively is considered useful for removal of a gold deposited on the surface of a silicon substrate. However, nitric acid contained in the aqua regia undesirably leads to the growth of an oxide film, failing to attain washing as expected.

The present inventors conducted the following experiments to find how much gold could be removed by, for example, aqua regia, etc. hitherto applied in acid washing.

A radioactive isotope $^{198}$Au was deposited on the surface of a silicon wafer at the rate of $9 \times 10^{13}$ atoms/cm$^2$, using a mixture of nitric acid and hydrofluoric acid containing the radioactive isotope $^{198}$Au. An attempt was made to wash off the isotope $^{198}$Au at 90° C. by aqua regia as well as by a washing solution formed of 1 part by volume of 1 N hydrochloric acid, 1 part by volume of 30% aqueous solution of hydrogen peroxide and 8 parts by volume of water considered most effective for removal of heavy metal and currently used in the manufacture of an integrated circuit. The results of the above-mentioned experiments are set forth in FIG. 2. A curve 1 represents the case where the isotope $^{198}$Au was washed by aque regia, and a curve 2 relates to the case where the isotope $^{198}$Au was washed by the mixture of hydrochloric acid, hydrogen peroxide and water. FIG. 2 shows that aqua regia washed the isotope $^{198}$Au only during the initial one minute and later failed to effect the washing, no matter how much time was consumed in the washing. The reason is assumed to be that as previously mentioned, application of aqua regia resulted in the growth of a very thin oxide film on the surface of a silicon wafer and the oxide film absorbed the isotope $^{198}$Au. The latter washing solution formed of hydrochloric acid and hydrogen peroxide indicated a slightly higher washing effect than aqua regia, probably because the solution had a weaker oxidizing power than aqua regia.

A heavy metal, particularly gold exerts an extremely harmful effect on a silicon semiconductor device. For example, even the presence of such a minute amount of gold as $10^{12}$atoms/cm$^3$ shortens the life of minority carrier stored in a silicon semiconductor device to degrade the properties of, for example, a resulting thyristor or a rectifying element for large high voltage current. A source of contaminating gold having the above-mentioned amount generally occurs in the intermediate steps of manufacturing an ordinary semiconductor device. Gold is sometimes carried into a solution formed of a mixture of nitric acid and hydrofluoric acid and customarily used to etch silicon.

Any of the above-mentioned acids, therefore, is unadapted to eliminate metals during the manufacture of a semiconductor device, for example, a high performance rectifying element for which a long life of minority carrier is demanded.

In view of the above-mentioned circumstances, the following cleaning and washing process has been developed and currently standardized for a silicon wafer, particularly, that used to manufacture a transistor or an integrated circuit. This process comprises the steps of:

(1) treating a silicon wafer with boiling trichloroethylene;

(2) subjecting the silicon wafer to ultrasonic cleaning in aceton and rinsing the wafer in aceton;

(3) washing the silicon wafer with running distilled water;

(4) treating the washed silicon wafer with a boiling solution formed of a mixture of 1 part by volume of sulfuric acid and 1 part by volume of nitric acid;

(5) washing the silicon wafer with running distilled water;

(6) treating the silicon wafer with boiling nitric acid;

(7) washing the silicon wafer with running distilled water;

(8) dipping the silicon wafer for 20 seconds in a dilute solution of hydrofluoric acid formed of, for example, 20 parts by volume of water and 1 part by volume of concentrated hydrofluoric acid;

(9) washing the silicon wafer with running distilled water; and

(10) drying the silicon wafer by centrifugal dehydration or by blowing high purity nitrogen gas on said wafer.

The steps (1) to (3) collectively denote a degreasing course using trichloroethylene, an alkali-free powerful solvent for organic materials. The steps (1) to (3) alone are insufficient for removal of organic materials such as finger prints and lapping oil which are left intact for a certain length of time. The steps (4) and (5) are undertaken for acid washing and decomposition of organic materials to complete the removal of organic materials. A more improved silicon wafer-washing process adopts a solution formed of a mixture of aqueous ammonia and an aqueous solution of hydrogen peroxide in place of the sulfuric acid-nitric acid solution. The steps (6) and (7) are used completely to remove inorganic materials such as metals by applying fresh nitric acid. A more improved silicon wafer-washing process adopts a solution formed of a mixture of hydrochloric acid and hydrogen peroxide instead of nitric acid. The steps (8) and (9) are intended to eliminate a very thin oxide film deposited on a silicon wafer during the step (4) and/or the step (6). The dilute hydrofluoric acid used in the step (8) may be replaced by salts of said hydrofluoric acid.

A silicon wafer is generally washed, for example, before the steps of oxidizing the silicon wafer and diffusing impurities therein. Therefore, a washing cycle including the aforesaid ten steps is repeated ten and odd times before a semiconductor device is fully manufactured. Moreover, washing is actually repeated as often as required during any of said ten steps. Consequently, it is not too much to say that washing occupies the greater portion of man work required for production of a semiconductor device. As mentioned above, one washing cycle practised at present is complicated due to many steps being involved. Moreover, this washing cycle is considerably expensive, because large amounts of volatile solvent and acid are used and various types of equipment have to be provided not only for washing but also for disposal of waste liquids.

Though dilute hydrofluoric acid and salts thereof can eliminate a thin oxide film produced during the acid washing step, yet chemicals of the fluorine series are very corrosive particularly to plant equipment and buildings. Therefore, the building and equipment of the stop where the fluorine series chemicals are handled should be made of such material as can fully withstand the corrosiveness of fluorine or provided with effective protection therefrom and moreover should be isolated from the shops where other washing steps are undertaken. Consequently, application of the fluorine series chemicals increases an overall washing plant cost.

Where the surface of a silicon wafer comprises silicon and silicon oxide used as a gate oxide film of, for example, a transistor, then the dilute hydrofluoric acid or salts thereof remove a thin oxide film deposited on the surface of the silicon during the immediately preceding acid washing step and only slightly etch said gate oxide film, thus offering great convenience. In this case, however, treatment with hydrofluoric acid or salts thereof renders the silicon oxide film portion of the silicon wafer surface very hydrophilic, but the silicon portion of the silicon wafer surface very water-repellent, sometimes making it impossible fully to wash off the hydrofluoric acid or salts thereof from said silicon portion by water. Where a gas such as $NO_2$ or $NO$ evolved during the preceding nitric acid washing step (6) is absorbed in dilute hydrofluoric acid applied in the following step (8) even in a small amount, then washing with such contaminated dilute hydrofluoric acid gives rise to a stained film on the silicon portion of a silicon wafer surface, presenting difficulties in the succeeding steps of diffusing impurities in the silicon wafer surface and fitting electrode to said surface. This is another reason why the hydrofluorine acid washing shop should be fully isolated from those where other washing steps are carried out. If, in the case where acid washing is applied to a silicon wafer finished by lapping with abrasives having an average particle size of 16 microns in order to produce a rectifying element or thyristor demanded to have a longer life of minority carrier than in an integrated circuit or transistor, an attempt is made to remove the abrasives, cuttings of lapped silicon or lapping oil under more rigid conditions, then there occurs the undesirable result of losing a thin lapping depletion layer produced by lapping and effectively applied as a heavy metal getter.

In the field of manufacturing a semiconductor device, photoetching is applied in partially removing a silicon oxide film selectively to diffuse an impurity and lead out electrodes, mesa etching of a silicon wafer and also in partially removing a deposited metal layer used as wiring. A photoresist used for the photoetching is known to have two types, that is, the negative- and positive-working types. The recent tendency is to adopt the positive-working type of photoresist, because it has a good resolving power and present clear-cut image outline.

A known material of the positive-working photoresist is a condensate of naphthoquinone-1,2 diamidosulfonyl chloride and novolak resin. When exposed to a light, the naphthoquinone-1,2 diamido radical of the condensate evolves nitrogen and is converted into ketene. When mixed with a minute amount of water, the naphthoquinone-1,2 diamido radical is turned into alkali-soluble indene carboxylic acid. An aqueous solution containing a mixture of sodium phosphate and sodium silicate is generally used in removing the light-exposed portion of the positive-working photoresist (development). This etching solution containing alkali metal is objectionable for the manufacture of a semiconductor device for the reasons set forth previously. In recent years, an alkaline developing solution formed of, for example, aminoalcohol free from alkali metal has come into use. However, this type of developing solution is practically unsatisfactory, because it has drawbacks such as an indistinct image outline and a low reproducibility of an image.

Mounting of wiring on a semiconductor device is carried out by the steps of forming an insulation oxide film on the surface of a silicon wafer after diffusion of an impurity therein; depositing a thin layer of good conductivity metal such as aluminum by vacuum evaporation on the insulation oxide film; mounting a photoresist film on the thin metal layer; exposing the prescribed portions of the photoresist film to a light through a photomask; boring the photoresist film with holes at specified points; dipping the semiconductor device thus treated in a metal-removing etchant to cause the prescribed portions of the metal layer to be etched off by the etchant introduced through the holes. This process provides wiring having a desired pattern. Since the metal layer is customarily formed of aluminum, an etchant containing an alkali metal is not used for the previously described reason. An etchant for aluminum soluble in both acid and alkali is preferably formed of an acid type, such as a phosphoric series (phosphoric acid, phosphoric acid plus nitric acid, phosphoric acid plus nitric acid plus acetic acid).

When reacted with aluminum, a phosphoric series etchant generally evolves hydrogen gas through the undermentioned process:

$$2Al + 2H_3PO_4 \rightarrow 2AlPO_4 + 3H_2 \uparrow$$

This hydrogen gas remains in the etchant in the form of bubbles. Since, however, the phosphoric series etchant normally has as high a viscosity as 20 to 50 centipoises, the hydrogen bubbles are attached to the surface of an aluminum film. Those portions of the aluminium layer which are covered with hydrogen bubbles are not etched. Where an attempt is made to etch said hydrogen bubble-covered portions under more rigid conditions, than those portions of the aluminum layer on which hydrogen bubbles are not deposited are unnecessarily etched. Therefore, a phosphoric series etchant is not fully satisfactory for practical purpose.

It is accordingly an object of the invention to provide a surface-treating agent adapted primarily for the intermediate steps of manufacturing a semiconductor device.

Another object of the invention is to provide a surface-treating agent adapted to treat by a simple process the surface of intermediate products obtained in the respective steps of manufacturing a semiconductor device.

Another object of the invention is to provide a surface-treating agent adapted to clean the surface of the intermediate products.

Still another object of the invention is to provide a surface-treating agent capable of removing those portions of a positive-working photoresist film formed on the surface of a semiconductor wafer which are or are not exposed to a light.

A further object of the invention is to provide surface-treating agent capable of etching a metal layer deposited on a semiconductor wafer.

These and other objects which will be apparent from the following description can be attained by a surface-treating agent adapted for the intermediate steps of manufacturing a semiconductor device, which comprises an aqueous solution containing 0.01 to 20% by weight of at least one trialkyl-(hydroxyalkyl)ammonium hydroxide expressed by the formula:

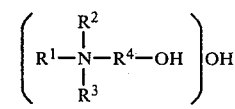

where $R^1$, $R^2$ and $R^3$ are alkyl groups each having 1 to 4 carbon atoms, and $R^4$ is an alkylene group having 2 to 4 carbon atoms.

Throughout the specification and appended claims, the term "surface" or "surface portion" is defined to mean the surface portion of intermediate products obtained in the respective steps of manufacturing a semiconductor device. Namely, the term "surface portion" denotes the surface of a wafer just as sliced off from an ingot, a wafer in which an impurity has been diffused, an oxide film produced on the wafer, a photoresist mounted on the surface of the wafer and a metal layer deposited on the surface of the wafer. The term "treat" or "treating" is defined to represent the process of washing the above-mentioned various surface portions, removing the photoresist selectively or wholly, and etching the metal layer.

This invention can be more fully understood from the following detailed description when taken in conjunction with the accompanying drawings, in which:

FIGS. 1A and 1B present the results of experiments conducted to determine the harmful effect of an alkali metal on the properties of a semiconductor device;

Figure 5:
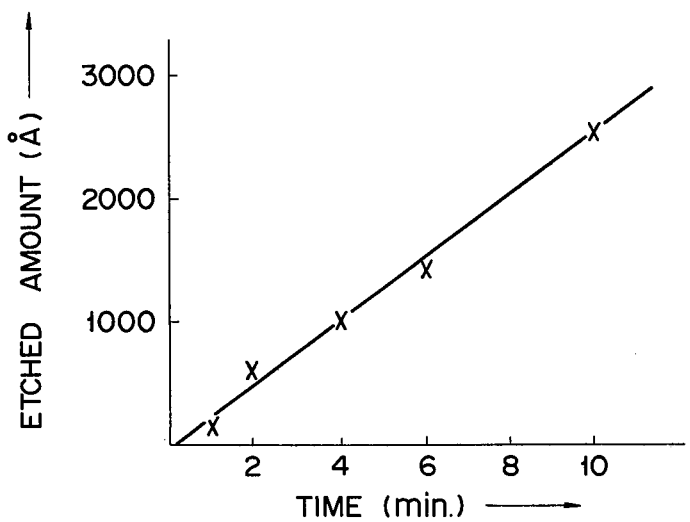
Figure 6:
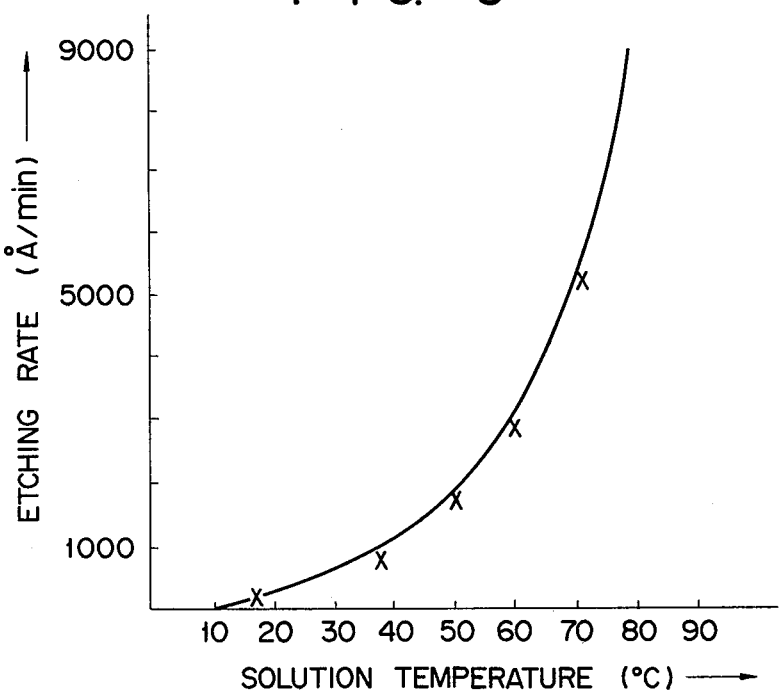

FIG. 5 sets forth a change with time in an amount of an aluminum layer etched by the surface-treating agent of the invention; and FIG. 6 illustrates the effect of temperature on the rate at which an aluminum layer is etched by the surface-treating agent of this invention.

The surface active agent of this invention comprises an aqueous solution containing one or more of trialkyl(-hydroxyalkyl)ammonium hydroxide (hereinafter abbreviated as "THAH") expressed by the formula:

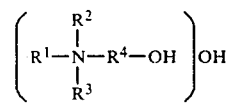

As mentioned above, $R^1$, $R^2$ and $R^3$ are alkyl groups each having 1 to 4 carbon atoms, and $R^4$ is an alkylene group having 2 to 4 carbon atoms.

THAH compound contained in the surface-treating agent of this invention preferably includes trimethyl(2-hydroxyethyl)ammmonium hydroxide (also referred to as "cholin"), triethyl(2-hydroxyethyl)ammonium hydroxide, tripropyl(2-hydroxyethyl)ammonium hydroxide, tributyl(2-hydroxyethyl)ammonium hydroxide, dimethylethyl(2-hydroxyethyl)ammonium hydroxide, trimethyl(3-hydroxypropyl)ammonium hydroxide, trimethyl(3-hydroxybutyl)ammonium hydroxide or a mixture thereof, and trimethyl(4-hydroxybutyl)ammonium hydroxide. Most preferred among these compounds are cholin, triethyl(2-hydroxyethyl) ammonium hydroxide, and trimethyl(3-hydroxypropyl) ammonium hydroxide or a mixture thereof.

THAH used in this invention can be easily prepared by reacting trialkylamine whose alkyl groups respectively have 1 to 4 carbon atoms with epoxide having 2 to 4 carbon atoms in the presence of water. THAH itself is not only free from most objectionable contaminants in the manufacture of a semiconductor device such as alkali metals, for example, sodium and heavy metals like copper, silver and gold, but also is not mixed with these contaminants during its manufacture. Therefore, application of THAH in treating the previously defined surface portion does not give rise to the so-called contrary contamination. Further, THAH is readily soluble in water and can be easily washed off with water. Even where THAH happens to remain attached to the surface portion, heating at about 100° C. decomposes THAH into harmless glycol and trialkylamine, offering great advantage.

Where the surface portion of intermediate products obtained in the respective steps of manufacturing a semiconductor device is washed by the surface-treating agent of the invention, the product has only to be immersed 5 to 20 minutes in said agent kept at 70° to 90° C. as more preferably subjected to ultrasonic cleaning. A THAH solution used in this case contains 0.01% to 20% by weight, more preferably 0.1 to 5% by weight, especially 1 to 3% by weight of THAH. A THAH solution according to this invention may also contain 5 to 20% by weight of THAH.

THAH, the useful component of the surface-treating agent of the invention, is a very alkaline material. As previously mentioned, an alkaline solution, for example, that containing sodium hydroxide, is known to remove organic materials, for example, animal and vegetable oils. The higher the basicity of the alkaline solution, the more effective is said removal. The degree of dissociation $pK_b$ of THAH substantially stands at zero as measured in water, proving that THAH has a considerably high basicity comparable to sodium hydroxide, and is very effective to remove organic materials deposited on the surface of intermediate products of a semiconductor device. An aqueous THAH solution has a pH value of 12.84 when 1% by weight of THAH is contained and a pH value of 12.20 when the THAH content is 0.1% by weight, whereas a 0.5% aqueous solution of sodium hydroxide indicates a pH value of 12.7. This fact shows that evan a smaller amount of THAH than sodium hydroxide has a greater removing power.

The THAH solution is very effective to dissolve alkali metals such as sodium, aluminum, amorphous silicon powders, and crystalline silicon powder which are brought into contact with the surface of intermediate products of a semiconductor device, and moreover forms a water-soluble complex with heavy metals such as gold, silver and copper. When contacted by the aqueous THAH solution, the silicon and silicon oxide portions of the surface of a silicon wafer are rendered prominently hydrophilic, and conveniently washed off with water. For instance, where the silicon portion of said surface is treated with dilute hydrofluoric acid, the contact angle of water particles indicates 60° to 70°. In contrast, where the silicon portion is treated with the aqueous THAH solution, the contact angle of water particles shows 7°, rendering the silicon portion very hydrophilic. Where the silicon oxide portion of the surface of a silicon wafer is treated with hydrofluoric acid, water particles show a contact angle of 7°. When the silicon oxide portion is treated with THAH, water particles present the same contact angle of 7°, making said silicon oxide portion very hydrophilic.

The aqueous THAH solution etches a silicon oxide film thermally produced on a silicon wafer and a silicon oxide film formed by gas phase growth on said wafer at a far smaller rate than an aqueous solution of sodium hydroxide having about the same basicity. Table A below shows a comparison between the etching rate of an aqueous cholin solution and that of an aqueous sodium hydroxide solution.

Table A

| | Etching rate | |
|---|---|---|
| Treated surface portion | 0.5% aqueous cholin solution | 1% aqueous NaOH solution |
| Thermally produced silicon oxide film (1) | 2.6Å/min | 13Å/min |
| Silicon oxide film produced | | |

Table A-continued

| | Etching rate | |
|---|---|---|
| Treated surface portion | 0.5% aqueous cholin solution | 1% aqueous NaOH solution |
| by gas phase growth (2) | 6.9Å/min | 56Å/min |

Note:
(1) Steam oxidation at 1200° C.
(2) Reaction between SiH$_4$ and O$_2$ at 500° C.

As mentioned above, the aqueous THAH solution etches a silicon oxide film having a relatively great thickness at a small rate, but easily removes an extremely thin silicon oxide film produced, for example, while a silicon wafer is allowed to stand. Such a very thin silicon oxide film produced by atmospheric oxygen generally has a thickness of 20 to 30 Å. While hydrofluoric acid decreases the thickness of such thin silicon oxide film to about 5 Å, 0.5% aqueous THAH solution of this invention kept at 90° C. decreases the thickness of said silicon oxide film to the same extent only in one minute.

Figure 3:
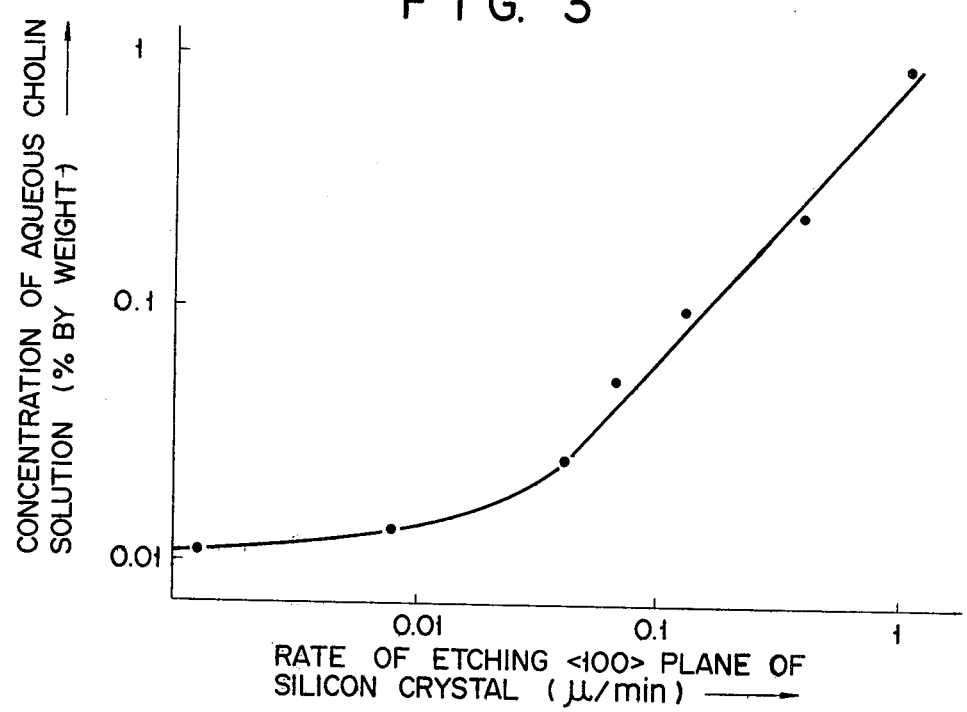
FIG. 3 shows the rate at which the surface-treating agent of this invention etches the <100> plane of a silicon wafer.

The aqueous THAH solution shows the same degree of dependency as a mixed solution of ethylenediamine and pyrocatechol on the orientation of a particular plane of a silicon crystal. Namely, a silicon crystal having a <111> plane resists etching by the aqueous THAH solution, whereas a silicon crystal having a <100> plane is readily etched by said solution. FIG. 3 shows how much an N type silicon wafer having a specific resistance of 30 Ωcm and a crystal plane of <100> is etched by the different concentration of an aqueous cholin solution at 90° C. The etching rate does not change much by the conductivity type and specific resistance of a silicon wafer.

It has been found that etching of the crystal plane of <100> can be suppressed by adding to 100 parts by weight of an aqueous THAH solution of the invention 0.003 to 30 parts by weight, preferably 0.06 to 3 parts, or more preferably 0.06 to 1.5 parts by weight of H$_2$O$_2$, without changing the effect of THAH. For illustration, determination was made of the solubility of a mirror-finished silicon wafer having a specific resistance of 1 Ωcm and a crystal plane of <100> by immersing said wafer 20 minutes at 90° C. in five samples of 0.5% aqueous cholin solution, that is, four samples, 100 parts by weight of which were mixed with 0.3, 0.03, 0.003 and 0.0003 part by weight of H$_2$O$_2$, and the remaining sample consisting of said cholin solution itself. It was found that the silicon wafer was etched at the rate of 0.001 microns/min, 0.002 microns/min, 0.140 microns/min, 0.340 microns/min, and 0.301 microns/min by the above-mentioned five samples of 0.5% aqueous cholin solution. The above experiments prove that application of H$_2$O$_2$ in an amount of not less than 0.003 parts appreciably suppressed the etching of the silicon wafer having a <100> plane by the cholin solution.

The present inventors further have found that THAH more effectively washes particularly heavy metals by mixing 100 parts by weight of an aqueous THAH solution of the invention with 0.01 to 10 parts by weight, preferably 0.5 to 5 parts by weight of a water-soluble complexing agent capable of forming a water-soluble complex with metal. The complexing agent typically includes sodium cyanide, potassium cyanide, ammonium cyanide, sodium ethylenediaminetetraacetate, potassium ethylenediamidetetraacetate, triethanolamine, ethylenediamine, ethylenediaminetetraacetic acid and cuproin, and mixtrues thereof.

A smaller amount of the complexing agent than 0.01 part by weight is not effective, while a larger amount of the complexing agent than 10 parts by weight causes sodium or potassium contained in the complexing agent to exert the previously mentioned harmful effect.

The surface-treating agent formed of an aqueous THAH solution may contain 0.001 to 5 parts by weight, preferably 0.01 to 2 parts by weight, of a nonionic surfactant based on 100 parts by weight of an aqueous THAH solution of the invention. The surfactant, like H$_2$O$_2$, has been found to suppress the etching of a <100> plane of a silicon crystal and to decrease the surface tension of an aqueous THAH solution, causing the aqueous THAH solution more wettable to a surface to be treated. Preferred examples of nonionic surfactant are aliphatic acid esters of polyhydric alcohols, and polyoxyethylene type represented by the formulae:

$R-O(CH_2CH_2O)_mH$;

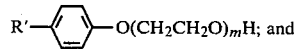$-O(CH_2CH_2O)_mH$; and $R''-COO(CH_2CH_2O)_nH$ where R and R'' are alkyl groups each having 12 to 18 carbon atoms, R' is an alkyl group having 8 or 9 carbon atoms, m is 8 to 15, and n is 5 to 30.

As described above, the surface-treating agent of this invention has the advantages that organic and inorganic contaminants deposited on the surface of intermediate products of a semiconductor device are effectively removed by a very simple process. After being treated with the surface-treating agent, the surface of the intermediate products has only to be washed with distilled water by the customary process, followed by drying. It is unnecessary to provide facilities for disposing of gases and liquids derived from organic solvents or for treating various acids as has been the case with application of the prior art surface-treating agent. Moreover, salts obtained by neutralizing THAH are nontoxic, and trialkylamine produced upon decomposition of THAH is only slightly odorous, substantially eliminating the necessity of using any deodorizing device.

Figure 4:
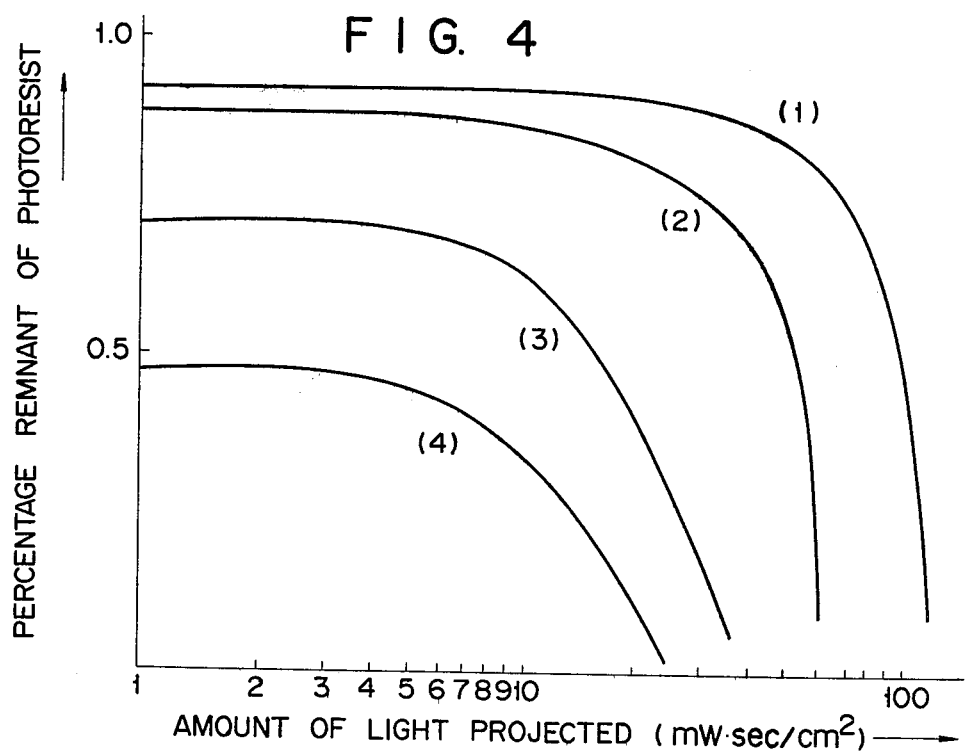
FIG. 4 is a graph indicating the extent to which a positive-working photoresist film is removed by the surface-treating agent of this invention.

The surface-treating agent of this invention is also useful for removal of a positive-working photoresist film applied in photoetching. Namely, an aqueous solution containing 1 to 10% by weight, preferably 1 to 7% by weight, more preferably 2 to 5% by weight of THAH is used to remove (development) those portions of the photoresist which are exposed to a light, and an aqueous solution containing more than 10 up to 20% by weight, is applied in etching those portions of the photoresist which are not exposed to a light. FIG. 4 illustrates the results of determining the relationship of the percentage remnant of a positive-working photoresist (a ratio of the thickness of said photoresist after development to that thereof before development) and an amount of light projected (mW sec/cm$^2$), with the concentration of an aqueous cholin solution taken as a parameter. The curve (1) of FIG. 4 represents the case where 1 wt.% aqueous cholin solution was used; the curve (2) denotes the case where 4 wt.% aqueous cholin solution was applied; the curve (3) relates to the case of 6 wt.% aqueous cholin solution; and the curve (4) relates to the case of 8 wt.% aqueous cholin solution. Other forms of THAH displayed substantially the same relationship as shown in FIG. 4. An aqueous solution of 1 to 10% by weight of THAH effectively removes a positive-working photoresist film. An aqueous solution containing a smaller amount of THAH than 1% by weight results in a low resolving power, whereas an aqueous solution containing a larger amount of THAH than 10% by weight unnecessarily dissolves those portions of the positive-working photoresist film which are not exposed to a light.

What is more convenient is that an aqueous solution containing 0.01 to 20% by weight of THAH is adapted to etch a wiring metal layer, particularly an aluminum layer formed on a semiconductor wafer. Selective etching of a metal layer is generally carried out by photoetching through the steps of vapor-depositing a metal layer on the surface of a semiconductor wafer, coating a photoresist film on said metal layer, etching or developing the photoresist film into a prescribed pattern and selectively etching the metal layer through the photoresist thus etched. The metal layer generally has a thickness of about 1 to 3 microns and is etched in two steps, initially at a relatively quick rate and later at a slow rate when the metal layer is etched to a thickness of about 1000 Å in order to avoid excess etching.

When etched by the surface-treating agent of the invention, a metal layer is preferably immersed several minutes in an aqueous solution containing 5 to 10% by weight of THAH at 60° to 70° C., and then the aqueous solution is cooled to room temperature to perform the latter step of etching. An aqueous solution containing 0.01 to 5% by weight of THAH has a relatively slow etching rate and should advisably be used in the latter step of etching.

FIG. 5 shows an amount of an aluminum layer etched by an aqueous solution containing 10% by weight of cholin relative to time consumed. FIG. 6 sets forth the rate of said etching relative to temperature applied. Referring to FIG. 5, a linear relationship occurs between the amount and time of etching. As seen from FIG. 6, the etching rate rapidly increases from around 60° C. An aqueous solution containing 0.01 to 5% by weight of THAH has substantially the same etching rate as that of an aqueous solution containing 10% by weight of choline at room temperature (or about 20° C.).

According to this invention, the surface of intermediate products obtained in the respective steps of manufacturing a semiconductor device can be satisfactorily treated, as described above, with an aqueous soloution containing at least one of the THAH compounds. Namely, cleaning of organic and inorganic contaiminants and selective etching of a metal layer can be effected by an aqueous solution containing 0.01 to 20% by weight of THAH; selective etching or development of those portions of a positive-working photoresist which are exposed to a light can be carried out by an aqueous solution containing 1 to 10% by weight of THAH; and removal of those portions of the positive-working photoresist which are not exposed to a light is attained by an aqueous solution containing more than 10 up to 20% by weight of THAH. It is possible to mix an aqueous THAH solution with any or combination of 0.003 to 30 parts by weight of $H_2O_2$, 1 to 10 parts by weight of a complexing agent and 0.001 to 20 parts by weight of a nonionic surfactant based on 100 parts by weight of THAH.

The surface-treating agent of this invention formed of an aqueous THAH solution which dissolves crystalline silicon powders and amorphous silicon powders is also applicable in cleaning the surface of the members of a quartz boat, crucible, reaction cylinder, gas phase growth device and the like. Silicon powders, cyrstalline or amorphous, can be completely washed off without the possibility of the above-mentioned members being unnecessarily etched simply by immersing the members about 20 minutes in a hog aqueous solution containing 0.01 to less than 0.1% by weight of THAH, about 10 minutes in a hot aqueous solution containing 0.1 to less than 1% by weight of THAH, or about 10 minutes in an aqueous solution containing 1 to 20% by weight of THAH and maintained at room temperature.

The above description mainly refers to silicon, but germanium, gallium phosphide and the like semiconductors can also benefit from a surface-treating agent according to the invention.

This invention will be more fully understood from the following examples. All parts and percentages in the examples are by weight, unless otherwise indicated.

EXAMPLE 1

Finger prints and sweat particles were purposely attached to the surface of a sample silicon wafer or the surface of a sample silicon oxide film formed on the silicon wafer. After a sufficient length of time was allowed to pass, the sample was immersed in a 0.5% aqueous cholin solution maintained at room temperature and subjected 10 minutes to ultrasonic cleaning. The finger prints and sweat particles were fully cleaned.

By way of comparison, an attempt was made to remove finger prints and sweat particles attached to said sample, using trichloroethylene or ammonia in place of the aqueous solution of cholin by the same process as described above. But these contaminants were not washed off. The experiments prove that the surface-treating agent of this invention has a strong power of cleaning organic materials.

EXAMPLE 2

A sample silicon wafer on which a silicon oxide film having a water particle contact angle of about 25° was formed was dipped in oil customarily used in lapping a silicon wafer, followed by heating. After being taken out of the lapping oil, the sample was dried. At this time, the sample indicated a water particle contact angle of 60°. The sample was dipped in a 1% aqueous cholin solution at 90° C. and subjected 10 minutes to ultrasonic cleaning. After said cleaning, the water particle contact angle of the surface of the silicon oxide film was about 25°, showing that the lapping oil was thoroughly cleaned.

EXAMPLE 3

A radioisotope $^{198}Au$ was adsorbed at the rate of $9 \times 10^{13}$ atoms/cm$^2$ to the surface of a sample silicon wafer having a crystal plane of <111> which was lapped with alundam abrasive having an average particle size of 16 microns. The sample was dipped in a 1% aqueous cholin solution at 60° C. and subjected to ultrasonic cleaning. Removed amounts of gold varying with time were determined by a radiation measurement method, the results being set forth by the curve 3 of FIG. 2. As seen from FIG. 2, the surface-treating agent of this invention has a far higher gold-removing power than aqua regia and a mixture of hydrochloric acid and $H_2O_2$.

EXAMPLE 4

A sample N type silicon wafer having a specific resistance of 200 to 300 Ωcm and lapped with abrasive material having an average particle size of 16 microns was washed with a 1% aqueous cholin solution in the same manner as in Example 3. The sample was again treated with a fresh batch of the 1% aqueous cholin solution and further washed 10 minutes with running distilled water obtained by straining deionized water through a filter of 0.3 micron mesh and later quickly dried by a high speed rotary drier. Thereafter, gallium was diffused in the sample by the sealed tube method to form a PN junction. When measured by the ordinary method, the minority carrier stored in the sample silicon wafer had life of 60 to 85 microseconds.

By way of comparison, a sample silicon wafer was washed with an $NH_4OH-H_2O_2$ solution and an $HCl-H_2O_2$ solution respectively in place of the 1% aqueous cholin solution in the same manner as described above. Gallium was diffused on the silicon wafer thus treated to provide a PN junction. However, the miority carrier stored in the sample silicon wafer had a life of 30 to 45 microseconds.

The above-mentioned experiments prove that the surface-treating agent of this invention fully cleaned metal contaminants deposited on the surface of a lapped silicon wafer which is usually difficult to clean.

EXAMPLE 5

This example was carried out in substantially the same manner as in Example 4, except that the 1% aqueous cholin solution was replaced by a 1% aqueous solution of triethyl (2-hydroxyethyl) ammonium hydroxide or a 1% aqueous solution of trimethyl(3-hydroxypropyl) ammonium hydroxide, obtaining substantially the same result.

EXAMPLE 6

A sample N type silicon substrate for epitaxial growth doped with high concentration of antimony and having a crystal plane of <111> was mechanically mirror finished by the customary process. After being allowed to stand 24 hours in the open air, the sample was dipped in a 1% aqueous cholin solution at 90° C., subjected 10 minutes to ultrasonic cleaning, washed 10 minutes with running distilled water obtained by straining deionized water through a filter of 0.3 micron mesh, and later dried by a high speed rotary drier. An N type epitaxially grown layer having a specific resistance of 5 to 6 Ωcm was formed on the sample silicon substrate with a thickness of 10 microns. Lamination defects occurred in the number of zero or two at most per square centimeter. An impurity presented a good profile in the epitaxially grown layer.

EXAMPLE 7

The 1% aqueous cholin solution used in Example 6 was replaced by the 1% aqueous cholin solution mixed with 0.06 part of $H_2O_2$ based on 100 parts of said solution. In other respects, experiments were carried out in the same manner as in Example 6 with the same results.

EXAMPLE 8

A sample mirror-finished silicon wafer having a specific resistance of 3 to 5 Ωcm and a crystal plane of <100> was dipped in a 0.5% aqueous cholin solution to which 1 part of $H_2O_2$ was added based on 100 parts of the cholin solution. The sample was subjected 10 minutes to ultrasonic cleaning, washed with running distilled water obtained by filtering deionized water, and dried by a rotary drier. A silicon oxide film was thermally formed on the surface of the sample silicon wafer with a thickness of 1000 Å. The silicon oxide layer was removed by dilute hydrofluoric acid. The sample was dipped in a fresh batch of the above-mentioned cholin solution containing $H_2O_2$, and subjected 10 minutes to ultrasonic cleaning at 70° C. Later, the sample was again washed 10 minutes with distilled water and dried by a rotary drier.

A silicon oxide film was thermally deposited at 1000° C. on the surface of the sample silicon wafer thus treated with a thickness of 1500 Å. The sample now provided with the silicon oxide film was fitted with an aluminium electrode to provide an MOS diode. This diode had flat band voltage of 1.4 V, and, when subjected to a bias temperature test at 300° C. under bias voltages of +20 V and −20 V, indicated a shift of only −0.1 V at both +BT and −BT forms of the test, that is, when positive and negative bias voltages were impressed, respectively. The surface-treating agent of this invention was found to remove impurities tending to increase the surface energy level of the MOS diode or those like sodium which had a movable nature.

EXAMPLE 9

Figure 1A:
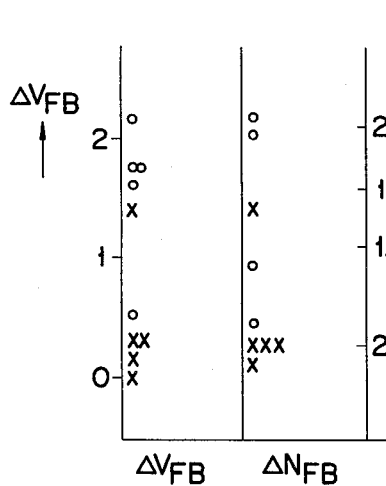
Figure 1B:
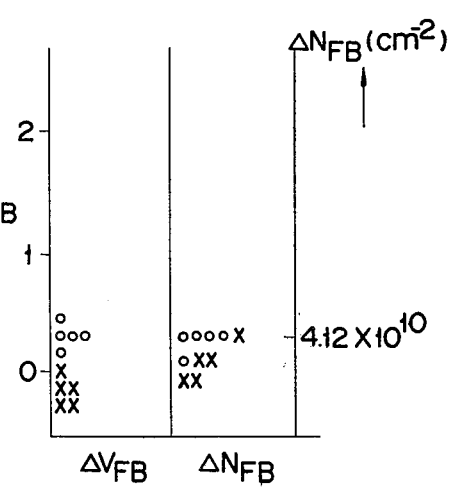
Figure 2:
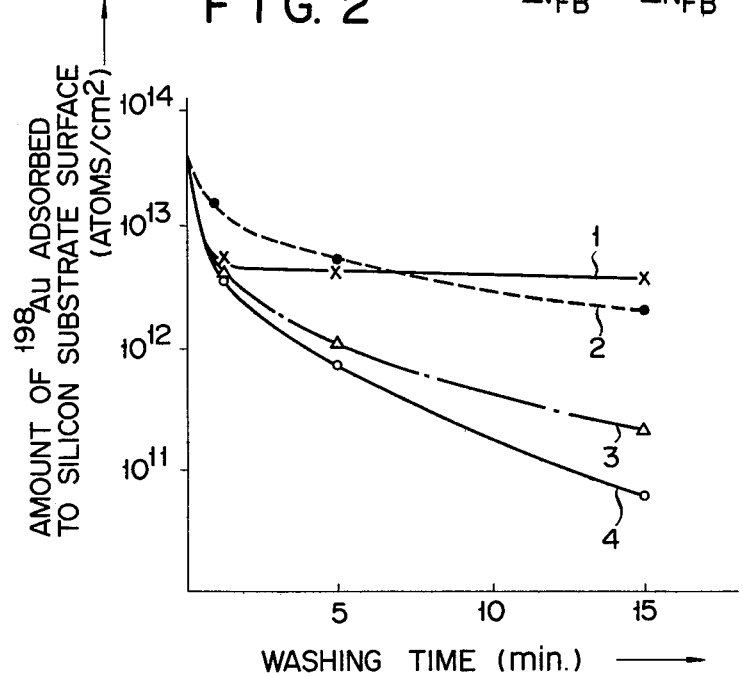
FIG. 2 is a graph comparing the metal-removing power of the surface-treating agent of this invention with that of the conventional surface-treating agents.

This example was carried out in substantially the same manner as in Example 3, excepting that the 1% aqueous cholin solution was replaced by a 1% aqueous cholin solution to which 1 part of $NH_4CN$ and 1 part of NaCN were added based on 100 parts of the 1% aqueous cholin solution. The results of experiments are indicated by the curve 4 of FIG. 2. FIG. 2 shows that the surface-treating agent of this invention mixed with the complexing agents was more effective to remove metal contaminants than the surface-treating agent of the invention which did not contain the complexing agent.

EXAMPLE 10

This example was made in substantially the same manner as in Example 4, excepting tht the 1% aqueous cholin solution was replaced by the surface-treating agent of Example 8, providing the same results as in Example 4.

EXAMPLE 11

This example was conducted in substantially the same manner as in, Example 8, excepting that the surface-treating agent formed of the aqueous cholin solution containing $H_2O_2$ was replaced by a surface-treating agent prepared by mixing a 0.5% aqueous cholin solution with 0.09 part of $H_2O_2$ and 5 parts of triethanolamine based on 100 parts of the 0.5% cholin solution. This example gave the same results as in Example 8.

EXAMPLE 12

This example was carried out in substantially the same manner as in Example 6, excepting that the 1% aqueous cholin solution was replaced by a 1% aqueous cholin solution to which 0.06 parts of $H_2O_2$ and 1 part of $NH_4CN$ were added based on 100 parts of the 1% cholin solution and that an N type silicon semiconductor substrate had a crystal plane of <100>. This example gave the same results as in Example 6. Moreover, the N type silicon semiconductor substrate itself was little etched by the above-mentioned cholin solution containing H₂O₂ and NH₄CN.

EXAMPLE 13

A silicon oxide film was formed on the surface of an N type silicon semiconductor substrate. A positive-working photoresist film was coated on the silicon oxide film, using a solution prepared by dissolving the raw material of a positive-working photoresist in an organic solvent. The photoresist film was heated about 20 minutes at 80° C. to evaporate the organic solvent and to suppress fogging. Later, a light was projected through a prescribed photomask aligned with the photoresist. Those portions of the photoresist on which a light was projected were etched by a 2.44% aqueous choline solution while those portions of the photoresist on which a light was not projected were left, thereby causing the surface of the silicon oxide film to be selectively exposed. An image pattern produced had a distinctly defined outline and a high precision.

The above-mentioned intermediate product was again heated 20 minutes at 120° C. to attain a closer attachment between the silicon oxide film and the remaining portion of the photoresist film. Later, the exposed silicon oxide film was etched out with dilute hydrofluoric acid. Those portions of the photoresist acting as an etching mask were removed by a 15% aqueous cholin solution, followed by water washing. The manufacture of a semiconductor device was completed by the succeeding steps of, for example, oxidation, diffusion of an impurity and deposition of a metal layer as customarily practised.

EXAMPLE 14

A silicon oxide film was formed on an N type silicon semiconductor substrate. Part of the silicon oxide film was removed by the ordinary photoetching process. After diffusion of an impurity, the remaining portion of the silicon oxide film as a diffusion mask was removed. A silicon oxide film was again formed. That portion of the newly formed silicon oxide film which faced a region of the diffused impurity was removed by photoetching. An aluminum film was deposited with a thickness of about 1 micron by vacuum evaporation all over the surface of the silicon semiconductor substrate.

Later, a negative-working photoresist was coated on the aluminum film. The photoresist was selectively exposed to a light through a photomask placed thereon, and those portions of the photoresist which were not exposed to a light were removed. The aluminum film was selectively etched 10 minutes through the removed portions of the photoresist film first by a 10% aqueous cholin solution at 60° C. and then by a fresh batch of the 10% aqueous cholin solution at room termperature. After washing with water, those portions of the photoresist film used as an aluminum-etching mask were removed, obtaining aluminum wiring. This aluminium wiring presented a high precision pattern.

EXAMPLE 15

Four treating agents A to D were prepared by adding to 0.5% aqueous cholin solution 1 part, 0.1 part, 0.01 part and 0.001 part of polyoxyethylene nonylphenol ether based on 100 parts of the 0.5% aqueous cholin solution, respectively. A mirror-finished silicon wafer having a specific resistance of 1 Ωcm and a crystal plane of <100> was immersed in the treating agent at 90° C. for 20 minutes. Then the etching rate of the silicon wafer by the treating agents was measured. The results are shown in Table B below, in which the etching rate in the case where 0.5% aqueous cholin solution was used along is referred to as E.

Table B

| Treating Agent | Etching rate (μ/min) |
|---|---|
| A | 0.006 |
| B | 0.002 |
| C | 0.007 |
| D | 0.017 |
| E | 0.301 |

Table B proves that the nonionic surfactant, though small in amount, can suppress the etching rate of the aqueous THAH solution even under heat.

Further, the nonionic surfactant was found to prevent H₂ gas generated during etching from attaching to the silicon wafer.

EXAMPLE 16

This example was carried out in substantially the same manner as in Example 8, but a treating agent consisting of 1 part of polyoxyethylene nonylphenol ether and 100 parts of 0.5% aqueous cholin solution was used, obtaining substantially the same result.

What we claim is:

1. A method for cleaning the surface of an intermediate product obtained in the manufacture of a semiconductor device which comprises bringing the surface of said intermediate product into contact with an aqueous solution at a temperature and for a time effective to clean the surface of said intermediate product, the aqueous solution containing an effective amount within the range of 0.01 to 20% by weight of at least one trialkyl(hydroxyalkyl) ammonium hydroxide expressed by the formula:

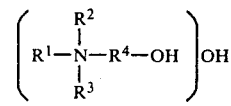

where $R^1$, $R^2$, and $R^3$ are alkyl groups each having one to four carbon atoms, and $R^4$ is an alkylene group having two to four carbon atoms.

2. A method according to claim 1, wherein the trialkyl(hydroxyalkyl)ammonium hydroxide is trimethyl(2-hydroxyethyl)ammonium hydroxide, triethyl(2-hydroxyethyl)ammonium hydroxide, tripropyl(2-hydroxyethyl)ammonium hydroxide, tributyl(2-hydroxyethyl)ammonium hydroxide, dimethylethyl(2-hydroxyethyl)ammonium hydroxide, trimethyl(3-hydroxypropyl)ammonium hydroxide, trimethyl(3-hydroxybutyl)ammonium hydroxide, trimethyl(4-hydroxybutyl)ammonium hydroxide, or a mixture thereof.

3. A method according to claim 1, wherein the trialkyl(hydroxyalkyl)ammonium hydroxide is trimethyl(2-hydroxyethyl)ammonium hydroxide, triethyl(2-hydroxyethyl)ammonium hydroxide, trimethyl(3-hydroxypropyl) ammonium hydroxide, or a mixture thereof.

4. A method according to claim 1, wherein the aqueous solution contains 5 to 20% by weight of the trialkyl(hydroxyalkyl)ammonium hydroxide.

5. A method according to claim 1 wherein the trialkyl(hydroxyalkyl)ammonium hydroxide comprises 0.1 to 5% by weight of the aqueous solution.

6. A method according to claim 5 wherein the aqueous solution contains 1 to 3% by weight of the trialkyl(hydroxyalkyl)ammonium hydroxide.

7. A method according to claim 1, wherein the aqueous solution further comprises 0.01 to 10 parts by weight, based on 100 parts by weight of the aqueous solution, of at least one complexing agent capable of forming a water-soluble complex with metals.

8. A method according to claim 7, wherein the complexing agent is sodium cyanide, potassium cyanide, ammonium cyanide, ethylenediaminetetraacetic acid, sodium ethylenediaminetetraacetate, potassium etyhlenediaminetetraacetate, triethanolamine, ethylenediamine, cuproin, or a mixture thereof.

9. A method according to claim 8, wherein the amount of the complexing agent is 0.1 to 3 parts by weight.

10. A method according to claim 1, wherein the aqueous solution further comprises 0.001 to 5 parts by weight of at least one nonionic surfactant based on 100 parts by weight of the aqueous solution.

11. A method according to claim 10, wherein the amount of the nonionic surfactant is 0.01 to 2 parts by weight.

12. A method according to claim 10, wherein the nonionic surfactant is at least one polyoxyethylene type compound expressed by the formulae:

$$R-O(CH_2CH_2O)_mH;$$

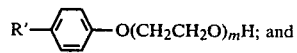

$$R''-COO(CH_2CH_2O)_nH$$

where R and R'' are alkyl groups each having 12 to 18 carbon atoms, R' is an alkyl group having 8 to 9 carbon atoms, m is 8 to 15, and n is 5 to 30.

13. A method according to claim 12, wherein the nonionic surfactant is polyoxyethylene nonylphenol ether.

14. A method according to claim 1, wherein the aqueous solution further comprises 0.003 to 30 parts by weight of hydrogen peroxide based on 100 parts by weight of the aqueous solution.

15. A method according to claim 14, wherein the amount of hydrogen peroxide is 0.06 to 3 parts by weight.

16. A method according to claim 14, wherein the amount of hydrogen peroxide is 0.06 to 1.5 parts by weight.

17. A method for cleaning the surface of an intermediate product obtained in the manufacture of a semiconductor device which comprises immersing said intermediate product in an aqueous solution for 5 to 20 minutes, said solution being maintained at a temperature from 70° to 90° C., said solution containing an effective amount within the range of 0.01 to 20% by weight of at least one trialkyl(hydroxylakyl) ammonium hydroxide expressed by the formula:

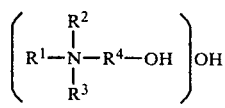

where $R^1$, $R^2$, and $R^3$ are alkyl groups each having one to four carbon atoms, and $R^4$ is an alkylene group having two to four carbon atoms.

20. A method according to claims 17, 18, or 19, wherein the aqueous solution further comprises 0.003 to 30 parts by weight of hydrogen peroxide based on 100 parts by weight of the aqueous solution.

21. A method according to claims 17, 18, or 19, wherein the aqueous solution further comprises 0.01 to 10 parts by weight, based on 100 parts by weight of the aqueous solution, of at least one complexing agent capable of forming a water-soluble complex with metals.

27. A method according to claims 17, 18, or 19, wherein the aqueous solution further comprises 0.001 to 5 parts by weight of at least one nonionic surfactant based on 100 parts by weight of the aqueous solution.

18. A method for removing a photoresist film from the surface of an intermediate product obtained in the manufacture of a semiconductor device which comprises bringing the surface of an intermediate product obtained in the manufacture of a semiconductor device having a positive-working photoresist film thereon into contact with an aqueous solution at a temperature and for a time effective to remove at least a portion of the photoresist film from the surface of the intermediate product, the aqueous solution containing an effective amount within the range of 0.01 to 20% by weight of at least one trialkyl(hydroxyalkyl) ammonium hydroxide expressed by the formula:

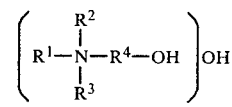

where $R^1$, $R^2$, and $R^3$ are alkyl groups each having one to four carbon atoms, and $R^4$ is an alkylene group having two to four carbon atoms.

22. A method according to claim 18, wherein the aqueous solution contains 1 to 10% by weight of the trialkyl(hydroxyalkyl)ammonium hydroxide.

23. A method according to claim 18, wherein the trialkyl(hydroxyalkyl)ammonium hydroxide is trimethyl(2-hydroxyethyl)ammonium hydroxide, triethyl(2-hydroxyethyl)ammonium hydroxide, tripropyl(2-hydroxyethyl)ammonium hydroxide, tributyl(2-hydroxyethyl)ammonium hydroxide, dimethylethyl(2-hydroxyethyl)ammonium hydroixde, trimethyl(3-hydroxypropyl)ammonium hydroxide, trimethyl(3-hydroxybutyl)ammonium hydroxide, trimethyl(4hydroxybutyl)ammonium hydroxide, or a mixture thereof.

24. A method according to claim 18, wherein the trialkyl(hydroxyalkyl)ammonium hydroxide is trimethyl(2-hydroxyethyl)ammonium hydroxide, triethyl(2-hydroxyethyl)ammonium hydroxide, trimethyl(3-hydroxypropyl)ammonium hydroxide, or a mixture thereof.

25. A method according to claim 18, wherein the aqueous solution contains more than 10 up to 20% by weight of the trialkyl(hydroxyalkyl)ammonium hydroxide.

26. A method according to claim 18, wherein the trialkyl(hydroxyalkyl)ammonium hydroxide comprises 1 to 10% by weight of the aqueous solution where the photoresist film is exposed to light; and wherein the trialkyl(hydroxyalkyl)ammonium hydroxide comprises more than 10 up to 20% by weight of the aqueous solution where the photoresist film is not exposed to light.

19. A method for etching a metal layer in the surface of an intermediate product obtained in the manufacture of a semiconductor device which comprises bringing the surface of an intermediate product obtained in the manufacture of a semiconductor device having a metal layer thereon into contact with an aqueous solution at a temperature and for a time effective to etch at least a portion of the metal layer, the aqueous solution containing an effective amount within the range of 0.01 to 20% by weight of at least one trialkyl(hydroxyalkyl)ammonium hydroxide expressed by the formula:

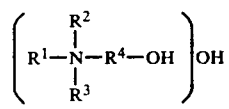

where $R^1$, $R^2$, and $R^3$ are alkyl groups each having one to four carbon atoms, and $R^4$ is an alkylene group having two to four carbon atoms.

28. A method according to claim 19, wherein the trialkyl(hydroxyalkyl)ammonium hydroxide is trimethyl(2-hydroxyethyl)ammonium hydroxide, triethyl(2-hydroxyethyl)ammonium hydroxide, tripropyl(2-hydroxyethyl)ammonium hydroxide, tributyl(2-hydroxyethyl)ammonium hydroxide, dimethylethyl(2-hydroxyethyl)ammonium hydroxide, trimthyl(3-hydroxypropyl)ammonium hydroxide, trimethyl(3-hydroxybutyl)ammonium hydroxide, or a mixture thereof.

29. A method according to claim 19, wherein the trialkyl(hydroxyalkyl)ammonium hydroxide is trimethyl(2-hydroxyethyl)ammonium hydroxide, triethyl(2-hydroxyethyl)ammonium hydroxide, trimethyl(3-hydroxypropyl)ammonium hydroxide, or a mixture thereof.

30. A surface-treating agent according to claim 19, wherein the aqueous solution contains 5 to 10% by weight of the trialkyl(hydroxyalkyl)ammonium hydroxide.

31. A method according to claim 19, wherein the intermediate product is immersed in the aqueous solution for a time effective to etch the metal layer, the aqueous solution being maintained at a temperature of 60° to 70° C.

32. A method according to claim 19, wherein the trialkyl(hydroxyalkyl)ammonium hydroxide comprises from 5 to 10% by weight of the aqueous solution, and the trialkyl(hydroxyalkyl)ammonium hydroxide is applied to said intermediate product by immersing said intermediate product in the aqueous solution.

* * * * *

UNITED STATES PATENT AND TRADEMARK OFFICE
CERTIFICATE OF CORRECTION

PATENT NO. : 4,239,661
DATED : December 16, 1980
INVENTOR(S) : Hisashi Muraoka et al.

It is certified that error appears in the above—identified patent and that said Letters Patent is hereby corrected as shown below:

In claim 17, line 8, "one trialkyl (hydroxylakyl)" should be --one trialkyl (hydroxyalkyl)--;

In claim 23, line 7, "hydroixde" should be --hydroxide--; and

In claim 23, next to the last line, "trimethyl (4hy-" should be --trimethyl (4-hy- --; and In claim 30, line 1, delete "surface-treating agent" and insert therefor --method--.

Signed and Sealed this

Twenty-first Day of April 1981

[SEAL]

Attest:

RENE D. TEGTMEYER

*Attesting Officer*   *Acting Commissioner of Patents and Trademarks*